US007154425B2

(12) United States Patent
Venditti et al.

(10) Patent No.: US 7,154,425 B2
(45) Date of Patent: Dec. 26, 2006

(54) SUPERVISED INPUT CONVERTER

(75) Inventors: Robert A. Venditti, Needham, MA (US); Peter Grigorov, Billerica, MA (US); Alexey Y. Zaparovanny, Revere, MA (US)

(73) Assignee: Sensormatic Electronics Corporation, Boca Raton, FL (US)

( * ) Notice: Subject to any disclaimer, the term of this patent is extended or adjusted under 35 U.S.C. 154(b) by 0 days.

(21) Appl. No.: 10/637,388

(22) Filed: Aug. 8, 2003

(65) Prior Publication Data

US 2005/0030215 A1 Feb. 10, 2005

(51) Int. Cl.
*H03M 1/12* (2006.01)

(52) U.S. Cl. .................................................... 341/155

(58) Field of Classification Search ................ 341/144, 341/155, 118, 119, 120, 110; 236/47, 46 R, 236/51; 165/11, 1, 12
See application file for complete search history.

(56) References Cited

U.S. PATENT DOCUMENTS 3,387,282 A * 6/1968 Jacques ......................... 700/9
4,408,157 A * 10/1983 Beaubien .................... 324/712
6,312,061 B1 * 11/2001 Schliebe et al. .............. 303/20
6,320,451 B1 * 11/2001 Harvey et al. .............. 327/519

OTHER PUBLICATIONS

Chuck Wojslaw, XICOR Application Note AN124, Feb. 2000, found at www.xicor.com/pdf_files/an124.pdf.
XICOR X9250, "Quad Digitally Controlled Potentiometers (XDCP)", Jan. 31, 2003, found at www.xicor.com/pdf_files/x9250.pdf.

* cited by examiner

*Primary Examiner*—Brian Young
(74) *Attorney, Agent, or Firm*—Alan M. Weisberg; Christopher & Weisberg, P.A.

(57) ABSTRACT

A multiplexer selects an input signal from one of plural sensors. An A/D converter converts the selected input signal to a digital input value. A processor then determines, based on the digital input value, an output resistance to which the resistance of the selected sensor is to be translated. Finally, the processor controls a digital potentiometer corresponding to the selected sensor to the determined output resistance. In one embodiment, a conditioning circuit adjusts the gain of the input signal according to calibration data, effectively performing at least a part of the translation in the analog domain.

6 Claims, 4 Drawing Sheets

SUPERVISED INPUT CONVERTER

BACKGROUND OF THE INVENTION

To provide security against intrusion, many residential and commercial buildings, factories, parking garages, etc., use security systems. Such systems typically include motion and/or infrared sensors located throughout a facility, window and door detectors that indicate whether a door or window is open or shut, and one or more central panels that interface directly to these "supervised inputs."

FIGS. 1A and 1B are schematics of circuits typically used in supervised inputs such as window and door detectors.

FIG. 1A illustrates a typical normally-open switch circuit 10. When the switch 16 is open, only resistor R1 is seen, so the circuit 10 has a resistance of 2 k ohms. When the switch 16 is closed, resistor R1 is in parallel with resistor R2, yielding a net resistance of 1 k ohms. Thus, a resistance of 1 k ohms indicates that the switch is closed, while a resistance of 2 k ohms indicates that the switch is open.

FIG. 1B illustrates a typical normally-closed switch circuit 20. In this circuit 20, when the switch 26 is open, resistors R3 and R4 are in series, yielding a total resistance of 4 k ohms. On the other hand, when the switch 26 is closed, resistor R3 is shorted out, so the total resistance is from R4, i.e., 2 k ohms. Thus, a resistance of 2 k ohms indicates that the switch is closed, while a resistance of 4 k ohms indicates that the switch is open.

The resistive circuits 10, 20 of FIGS. 1A and 1B respectively also ensure that if an intruder were to physically cut the wires leading to the detector or short them together, the resulting resistance would approach infinity or zero ohms and would thus be detectable as a breach of the system.

Of course, the exact resistances may be different from the provided examples. In fact, one vendor's detectors typically are different from another's. For example, R1 may be 6 k ohms and R2 might be 18 k ohms. This can be a problem when a user (e.g., the owner of a house or the management of a facility) wants to upgrade to a new system (e.g., another vendor) and systems are incompatible. The expense of replacing all of the sensors, which may be buried in walls or even in concrete, may be extremely high.

In other words, when an existing access control system is replaced with another access control system, for example, that of another manufacturer, or even a different system of the same manufacturer, the various input switches that are already installed in the building may not be compatible with the new equipment. Prior to the present invention, an installer would typically be required to open each sensor and manually replace the termination resistors with the values expected by the new equipment. This can be a very labor intensive and time consuming process.

SUMMARY OF THE INVENTION

The present invention measures the resistances found in the sensor switches and alarm points and then, using digital potentiometers, converts the resistances proportionally to the range of resistance expected by the new system. A calibration process allows the use of the present invention with any value of termination resistors that are installed in the sensors.

The present invention can be used to retrofit existing access control systems while reducing the overall cost to remove the old system and install a new system. Users of such systems may either upgrade the access control system or replace it. Upon replacing the system, the extra costs of re-wiring the switches and alarm points may compel the user to use the same manufacturer. With the present invention, the total system cost will be less, and a replacement system easier to install.

The present invention can be considered a resistance translator or converter. For example, the present invention can convert the resistance of a sensing device such as an open-door detector or a thermistor from one range to another. For example, if a 1,000 ohm thermistor has previously been installed for use in temperature control, but the control panel expects the thermistor to be nominally 10,000 ohms, then an embodiment of the present invention can translate the 1,000 ohm thermistor's output resistance into the 10,000 ohm range.

A supervisory input converter according to an embodiment of the present invention can include a processor, a multiplexer, an analog-to-digital (A/D) converter, and a digital potentiometer for each supervisory input to be converted. The multiplexer selects, under control of the processor, an input signal from one of plural sensors. The A/D converter converts the selected input signal to a digital input value. The processor then determines, based on the digital input value, an output resistance to which the resistance of the selected sensor is to be translated. Finally, the processor controls a digital potentiometer corresponding to the selected sensor to the determined output resistance. In one embodiment, a conditioning circuit adjusts the gain of the input signal according to calibration data, effectively performing at least a part of the translation in the analog domain. The calibration date may be stored, for example, in a non-volatile memory such as NOVRAM.

One or more lamps, such as but not limited to LEDs, can be included to provide status indications. In addition, a serial interface may be included, through which one or more operations may be initiated and/or controlled, including but not limited to diagnostics, control, and/or calibration.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

An embodiment of the present invention is called a "supervisory input converter," and may be embodied, for example, in a printed circuit board. The supervised input converter may be an accessory product that converts supervised input signals into the range needed by replacement access control products. An embodiment of the present invention can be calibrated to work with different combinations of sensing resistors. A non-volatile memory can retain the calibration data upon loss of power. Connections can be made using removable terminal blocks to facilitate the installation and wiring process. Other types of connections can be used as well.

Figure 1A:
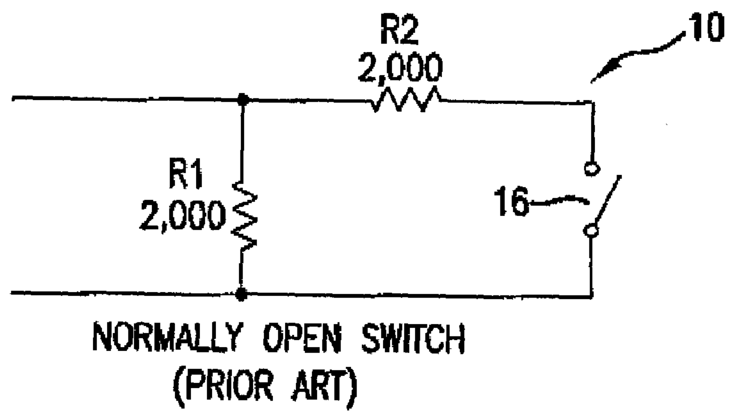
FIGS. 1A and 1B are schematics of typical supervised inputs.
Figure 1B:
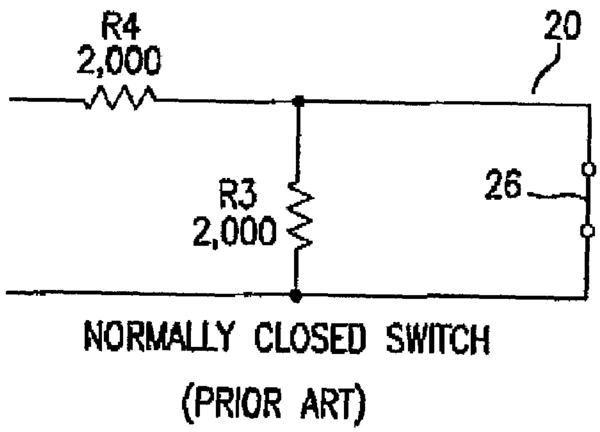
Figure 2:
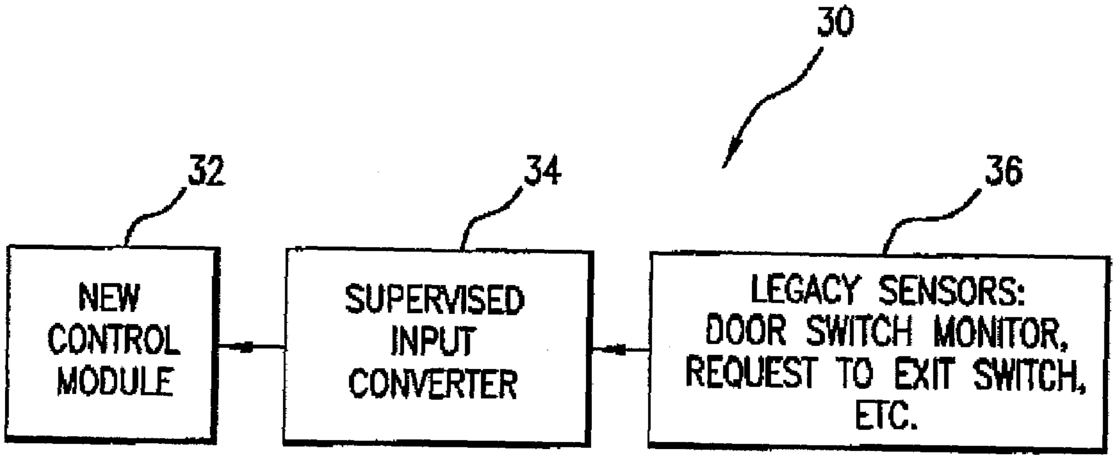
FIG. 2 is a high-level block diagram illustrating the logical placement of an embodiment of the present invention.

FIG. 2 is a high-level block diagram 30 illustrating the logical placement of an embodiment of the present invention. The supervised input converter 34 is placed between the legacy supervised inputs 36 and the new control module 32. The purpose of the supervised input converter 34 is to convert the resistances of the legacy supervised inputs 36 into the resistance values expected by the new control module 32. For example, a value of 2 k ohms indicating a closed switch may need to be converted to 6 k ohms for the new control module 32, while a value of 4 k ohms, indicating an open switch, may need to be converted to 8 k ohms or some other value.

Figure 3:
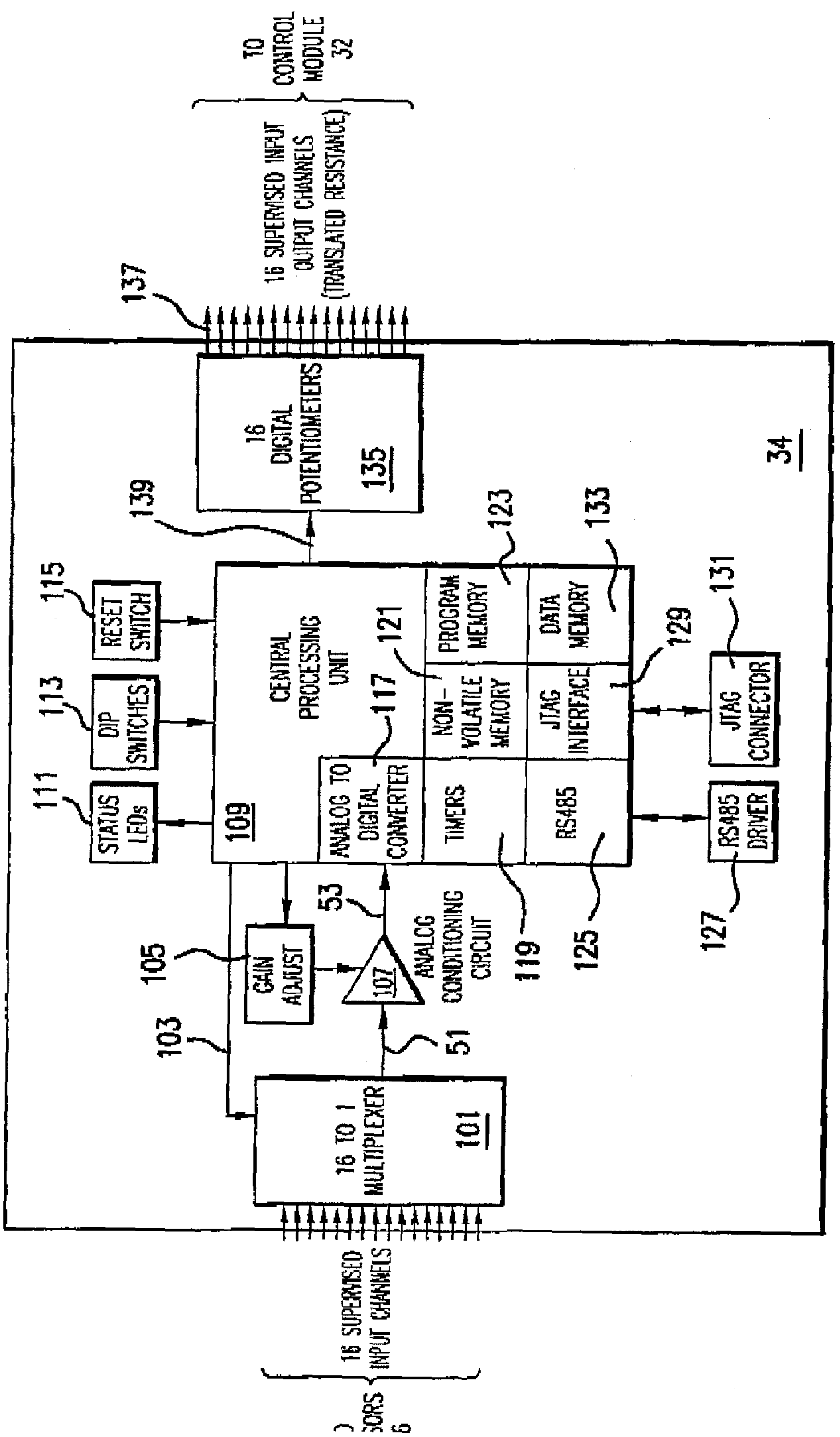
FIG. 3 is a schematic diagram of an embodiment of the supervised input converter of FIG. 2.

FIG. 3 is a schematic diagram of an embodiment of the supervised input converter 34 of FIG. 2. A processor 109 controls the operation of the converter 34. As shown, the CPU 109 includes an analog-to-digital (A/D) converter 117, one or more timers 119, non-volatile memory 121, program memory 123, data memory 133, a serial interface 125 and driver 127 for example according to the well-known RS-485 protocol, and a JTAG (IEEE 1149.1) interface 129 and connector 131. Although the processor 109 is shown to contain all of these individual components, it would be understood by one skilled in the art that one or more of these components 117–133 could as easily be physically distinct from the processor 109. In addition, certain of these components, such as the RS-485 and JTAG components (125–131), may not be present in certain embodiments of the invention. Furthermore, although the converter 34 shown in FIG. 3 has sixteen inputs and sixteen outputs, one skilled in the art would readily understand that other embodiments of the present invention could provide different numbers of inputs and outputs without changing the scope of the invention.

In operation, the processor 109 controls, through control signal 103 an input multiplexer 101 that is connected to one or more supervised input sensors 36, such as motion and/or infrared sensors, window and door detectors, or other types of sensors. These sensors 36 can be "legacy" sensors, that is, sensors previously installed, or newly installed sensors, or a mix. Although the exact configuration may vary, the embodiment depicted in FIG. 3 includes sixteen differential analog input channels that interface with the supervised inputs and sixteen solid-state resistance output channels.

The processor 109, via the multiplexer control signal 103, controls the multiplexer 101 to select one of the inputs 36. A current is pumped through the selected supervised input and the voltage drop across the supervised input, which is indicative of the resistive state of the associated sensor, is measured. Note that set or range of values returned by a particular sensor may depend on the brand, type, age, condition, etc. of the sensor.

The selected signal 51 is passed to an analog conditioning circuit 107 that can provide filtering of the signal as well as gain adjustment in response to a gain adjust circuit 105 under control of the processor 109.

The filtered/conditioned signal 53 is then passed to the A/D converter 117, which converts the signal to a digital value to be read and processed by the processor 109. Input sampling time in one embodiment is less than 1 msec per input.

The processor 109 uses this measurement to determine the resistance of the selected supervised input. Using calibration or other data stored, for example, in the non-volatile memory 121, the processor 109 determines, based on the resistance of the selected supervised input, a new resistance value, corresponding to the resistance expected by the control module 32. The calibration data may be stored, for example as a look-up or translation table. The processor 109, through control signal 139, then controls one of the digital potentiometer 135 to the determined resistance, in effect translating the resistance of the supervised input sensor to the resistance by the control module 32.

In one embodiment, LEDs 111 or other indicators visually provide status information. DIP switches 113, jumpers or the like are used to set certain parameters, for example, to indicate that upon activation of the reset switch 115, a calibration procedure is to be performed.

Figure 4:
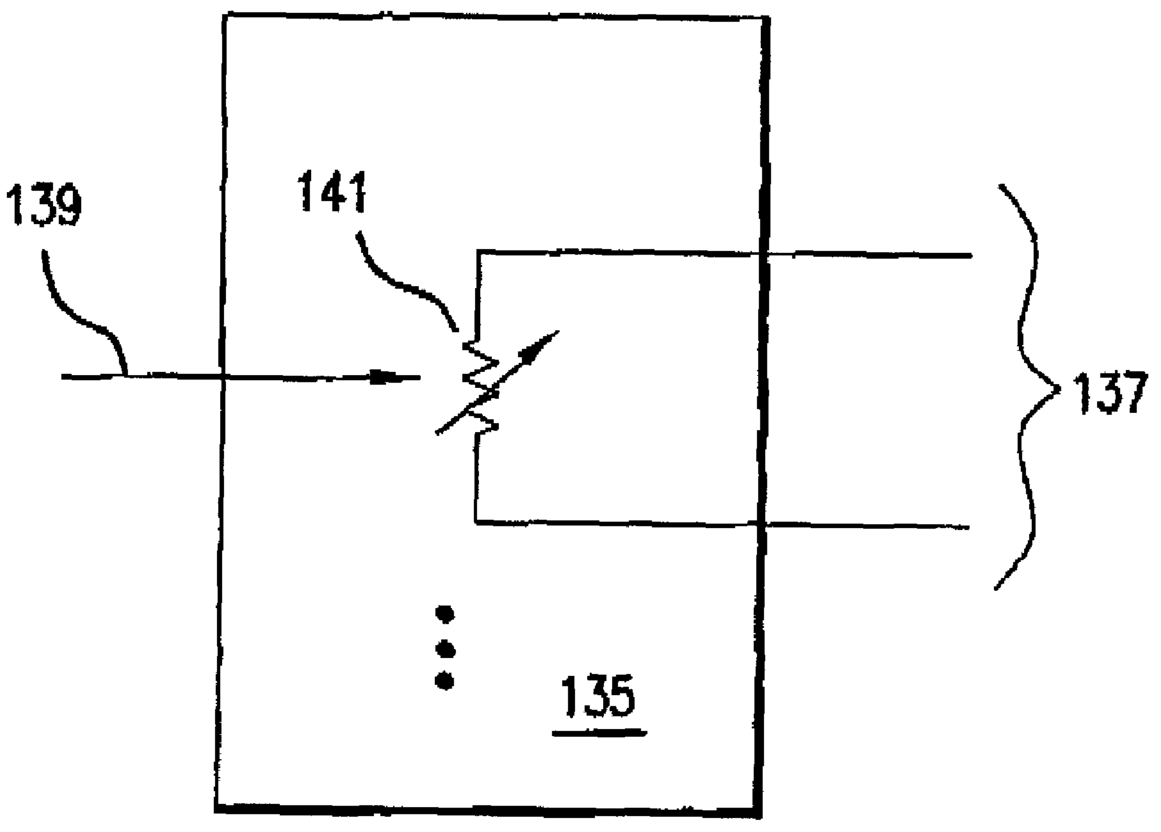
FIG. 4 is a schematic diagram illustrating an exemplary digital potentiometer of FIG. 3.

FIG. 4 is a schematic diagram illustrating an exemplary digital potentiometer 135 of FIG. 3. Schematically, a variable resistor 141 is controlled by a digital signal 139, to provide a differential output 137 having a resistance specified by the processor. A commercially available digital potentiometer, such as Xicor, Inc.'s X9250, may be used, although the present invention is not limited to this particular device.

Embodiments of the present invention may consume relatively low power. For example, the power consumption of a particular embodiment is 100 mA at 5 volts.

Normal Operation

In normal operation of one embodiment of the invention, the translation of input resistances is accomplished using the gain of the op-amp, or analog conditioning, circuitry 107 (FIG. 3).

Figure 5:
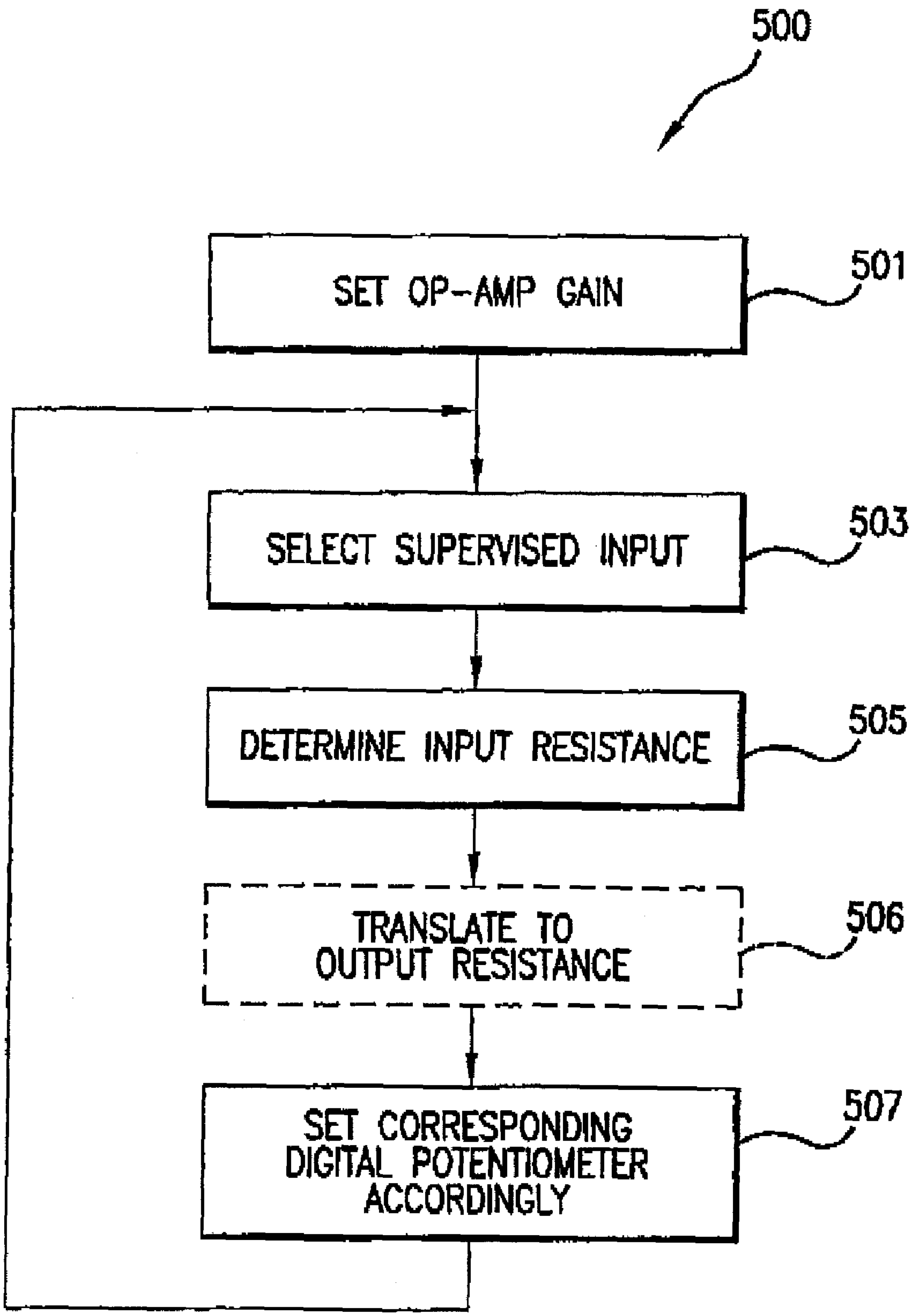
FIG. 5 is a flowchart illustrating operation of certain embodiments of the present invention.

FIG. 5 is a flowchart 500 illustrating operation of certain embodiments of the present invention.

First, in step 501, the gain of the op-amp 107 is set according to the value determined during calibration, described below. Next, one of the supervised inputs is selected (step 503). Then, the voltage across the input resistor of the selected supervised input is measured (step 505). Finally, the value of the corresponding digital pot is set in proportion to this measured voltage, providing the proper translated output resistance (step 507).

Using the op-amp 107 to essentially perform the translation in the analog domain allows the software to be very simple. Thus, step 506, the actual translation of the measured input resistance to the desired output resistance, is intrinsic to step 505 and is not a discrete step; step 506 is thus depicted with dashed lines.

Of course, in alternative embodiments, the translation could be performed as a discrete step 506 by the processor 109 (FIG. 3) under software control, or using a combination of software, digital and analog techniques.

Calibration

The supervised input converter must be calibrated to the supervision resistors in the supervised building. The currently described embodiment may be calibrated in a number of ways.

One such calibration procedure is now described:

First, the lowest value of two resistors R1 and R2 is used to determine the gain that is needed to set the output of the op-amp 107 (FIG. 3) to a voltage that results in a digital potentiometer setting of 1000 ohms, where, in this illustrative case, 1000 ohms is the lowest resistance value expected by the target system, e.g., the control module 32 of FIG. 3.

Next, the resistance value of R1+R2, i.e., R1 in series with R2, is the highest resistance that is expected to be measured in a normal state. This is the resistance that is measured when a normally-closed switch is open. This resistance is used to test the calibration at the high end. This resistance value is needed in the calibration process to ensure that the highest expected resistance in the system can be measured. If the A/D converter 117 (FIG. 3) saturates, for example because the measured resistance is too high, then the calibration process has failed.

Finally, the lowest resistance expected to be measured is the value of R1 in parallel with R2, i.e., R1||R2. The calibration process can check that this lowest expected resistance can be accurately measured. If the A/D converter 117 saturates at the low end, then the calibration process has failed.

For example, if the measured input resistance is exactly twice the value of the desired output resistance, then the gain of the op-amp is set to 0.5. In operation, if the input resistor is 2,000 ohms, and the gain is set to 0.5, then an input value corresponding to 1,000 ohms will be established by the A/D converter 117. The processor 109, reading this value, sets the corresponding output resistance to 1,000 ohms.

The calibration procedure may include connecting calibration resistors having the above values to specific inputs of the supervisory input converter, using various switches 113, 115 to initiate and terminate calibration, and using the indicator lamps 111 to indicate the status, e.g., in progress/success/failure, of the calibration process.

Communication Channel

An optional communication channel 125, 127, for example a serial RS-485 link, can provide the ability to transmit all signals through a communication channel instead of connecting the outputs of the supervised input converter 34 to the control module 32, which may now be remotely located. While this simplifies the wiring, the supervised input converter 34 is no longer transparent to the control module 32 because special programming is required to accommodate the communication channel. The communication channel may also be used for other purposes, including, but not limited to, diagnostics, remote control, manual entering of calibration data, and the like.

The solution presented by the present invention is much less expensive than the prior method of manually replacing sensors, as it is not necessary to modify every switch and alarm point. Some of the sensors may not even be easily accessible. For example, they may be installed inside a wall, inside a door, or in a ceiling.

While this invention has been particularly shown and described with references to preferred embodiments thereof, it will be understood by those skilled in the art that various changes in form and details may be made therein without departing from the scope of the invention encompassed by the appended claims.

What is claimed is:

1. A supervisory input converter, comprising:
a processor;
a multiplexer for selecting, under control of the processor, an input signal from one of plural sensors;
a conditioning circuit which adjusts gain of the input signal;
an analog-to-digital converter which converts the selected input signal to a digital input value, the processor then determining, based on the digital input value, an output resistance to which the resistance of the selected sensor is to be translated; and
a digital potentiometer corresponding to the selected sensor, the processor controlling the digital potentiometer to the determined output resistance.

2. The supervisory input converter of claim 1, further comprising:
at least one lamp providing a status indication.

3. The supervisory input converter of claim 1, further comprising:
non-volatile memory which holds calibration data.

4. The supervisory input converter of claim 1, further comprising:
a serial interface.

5. A method for converting supervised input signals, comprising:
selecting from a plurality of supervised inputs, each supervised input having a corresponding input resistance indicative of said supervised input's state;
adjusting gain of a signal from the selected supervised input signal, said signal prior to adjustment being indicative of said supervised input's resistance;
converting the selected supervised input's input resistance to a digital input value; and
controlling a digital potentiometer to a desired output resistance responsive to the digital input value.

6. An apparatus for converting supervised input signals, comprising:
means for selecting from a plurality of supervised inputs, each supervised input having a corresponding input resistance indicative of said supervised input's state;
means for converting the selected supervised input's input resistance to a digital input value;
means for adjusting gain of a signal from the selected supervised input signal, said signal prior to adjustment being indicative of said supervised input's resistance; and
means for controlling a digital potentiometer to a desired output resistance responsive to the digital input value.

* * * * *